US009977346B2

(12) United States Patent
Okada et al.

(10) Patent No.: US 9,977,346 B2
(45) Date of Patent: May 22, 2018

(54) LITHOGRAPHY APPARATUS, AND METHOD OF MANUFACTURING ARTICLE

(71) Applicant: CANON KABUSHIKI KAISHA, Tokyo (JP)

(72) Inventors: Tetsuji Okada, Saitama (JP); Tosiya Asano, Utsunomiya (JP); Naoki Maruyama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/428,488

(22) Filed: Feb. 9, 2017

(65) Prior Publication Data

US 2017/0242346 A1 Aug. 24, 2017

(30) Foreign Application Priority Data

Feb. 19, 2016 (JP) ................................ 2016-030264

(51) Int. Cl.
*G03F 7/20* (2006.01)

(52) U.S. Cl.
CPC ................................ *G03F 7/70725* (2013.01)

(58) Field of Classification Search
CPC ......................... G03F 7/70725; G03F 7/70358
USPC ........................................ 355/52, 53, 55, 72
See application file for complete search history.

(56) References Cited

U.S. PATENT DOCUMENTS 6,490,025 B1 * 12/2002 Makinouchi ........ G03F 7/70358 248/638
6,538,719 B1 * 3/2003 Takahashi ........... G03F 7/70358 355/53
8,956,143 B2 2/2015 Furumoto et al.
9,673,021 B2 * 6/2017 Ogawa .................... H01J 37/20
2002/0104950 A1 * 8/2002 Mayama ............... F16F 7/1005 248/638
2007/0164234 A1 * 7/2007 Tsuji .................. G03F 7/70725 250/491.1

FOREIGN PATENT DOCUMENTS

JP 2012142542 A 7/2012

* cited by examiner

*Primary Examiner* — Hung Henry Nguyen
(74) *Attorney, Agent, or Firm* — Rossi, Kimms & McDowell LLP

(57) ABSTRACT

The present invention provides a lithography apparatus which performs a process of forming a pattern on a substrate, the apparatus comprising a processing device configured to perform the process, an actuator configured to exert an action to the processing device, a detector configured to detect vibrations of a support for supporting the processing device, and a controller configured to control the actuator, wherein the controller is configured to perform an estimation of vibration transferred from the processing device to the detector, and control the actuator based on vibration obtained by the estimation and vibration detected by the detector.

14 Claims, 3 Drawing Sheets

100 11 10 111 4 112 17 15 122 12 121 16 1 3 1a 14 2 131 13 132 20 22 22 24 23 24 23 50 21 6 50 5 25 Z Y X 10b
20b
5
X
Z
Y
25a
16b
61
6
16a
31a
26a
27a
38a
37a
20a
23a
22a
32a
33a
10a
28a
34a
24a
29a
13a
36a
35a
23a
30a
22a
36a
6'
16c
31c
300
10c

LITHOGRAPHY APPARATUS, AND METHOD OF MANUFACTURING ARTICLE

BACKGROUND OF THE INVENTION

Field of the Invention

The present invention relates to a lithography apparatus, and a method of manufacturing an article.

Description of the Related Art

In some lithography apparatuses, a processing device which performs a process of forming a pattern on a substrate and a mechanism different from the processing device are provided on a common base plate. In the lithography apparatus having this arrangement, when, for example, the vibrations generated by the mechanism are transferred to the processing device through the base plate, overlay precision and transfer precision (pattern fidelity) can degrade in the processing device. For this reason, the lithography apparatus may be provided with an actuator which exerts an action on the processing device, and controls the actuator so as to reduce vibrations transferred from the mechanism to the processing device through the base plate.

Japanese Patent Laid-Open No. 2012-142542 discloses a lithography system including a first lithography apparatus (processing device) and a second lithography apparatus (mechanism) which are installed on a common fixed base (base plate). This lithography system controls a force applied to a vibration isolation target in the first lithography apparatus based on drive instruction information on a movable object in the second lithography apparatus so as to reduce the vibrations generated by the driving of the movable object and transferred to the vibration isolation target through the fixed base.

It seems possible to reduce vibrations transferred from the mechanism to the processing device by providing a detector which detects the vibrations of the base plate between the processing device and the mechanism and controlling a force applied to the processing device based on an output signal from the detector. However, this detector can simultaneously detect the vibrations generated by the processing device as well as the vibrations generated by the mechanism. For this reason, using an output signal from the detector without any change can make it difficult to control vibrations by the actuator.

SUMMARY OF THE INVENTION

The present invention provides, for example, a lithography apparatus advantageous in control of vibration of a processing device.

According to one aspect of the present invention, there is provided a lithography apparatus which performs a process of forming a pattern on a substrate, the apparatus comprising: a processing device configured to perform the process; an actuator configured to exert an action to the processing device; a detector configured to detect vibrations of a support for supporting the processing device; and a controller configured to control the actuator, wherein the controller is configured to perform an estimation of vibration transferred from the processing device to the detector, and control the actuator based on vibration obtained by the estimation and vibration detected by the detector.

Further features of the present invention will become apparent from the following description of exemplary embodiments with reference to the attached drawings.

DESCRIPTION OF THE EMBODIMENTS

Figure 1:
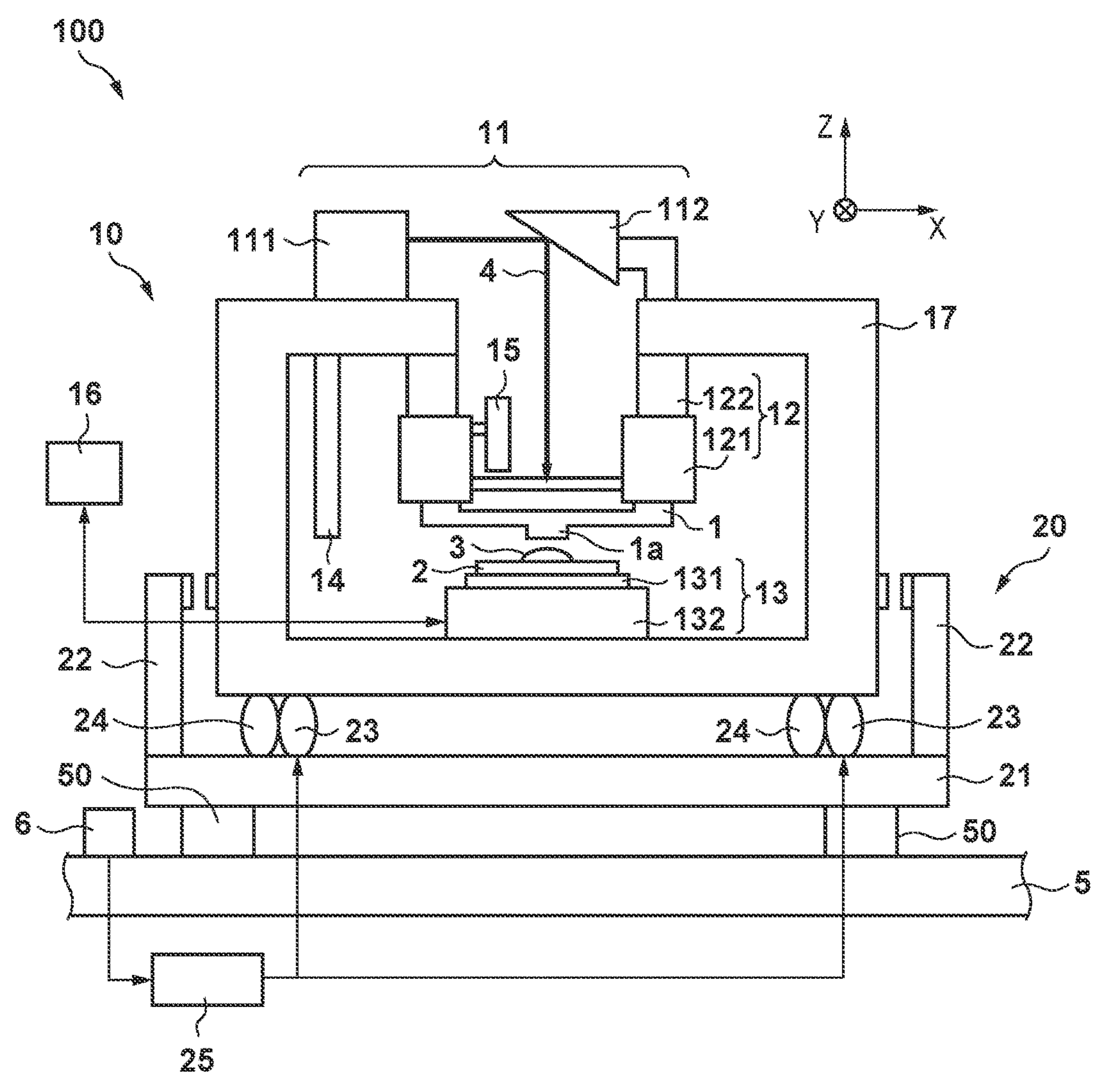
FIG. 1 is a schematic view showing an imprint apparatus.

Exemplary embodiments of the present invention will be described below with reference to the accompanying drawings. Note that the same reference numerals denote the same members throughout the drawings, and a repetitive description thereof will not be given. In addition, the following embodiments will exemplify a lithography apparatus as an imprint apparatus which forms a pattern on an imprint material on a substrate by using a mold. However, this is not exhaustive. For example, the present invention can be applied to lithography apparatuses such as an exposure apparatus which transfers a mask pattern onto a substrate and a drawing apparatus which forms a pattern on a substrate by irradiating it with charged particle radiation.

[Imprint Apparatus]

The arrangement of an imprint apparatus 100 will be described. The imprint apparatus 100 is used to manufacture semiconductor devices and the like. This apparatus performs an imprint process of forming a pattern on an imprint material 3 on a substrate by using a mold 1. For example, the imprint apparatus 100 cures the imprint material 3 (resin) on the substrate while the mold 1 is in contact with the imprint material 3. A pattern can be formed on the imprint material 3 on a substrate 2 by increasing the spacing between the mold 1 and the substrate 2 and separating (releasing) the mold 1 from the cured imprint material 3. Methods of curing the imprint material 3 include a heat cycle method using heat and a photo-curing method using light. An imprint apparatus using the photo-curing method will be described below. In addition, in the following drawings, a direction parallel to the optical axis of light with which the substrate 2 is irradiated is defined as the Z direction, and directions orthogonal to each other in a plane perpendicular to the Z direction are defined as the X and Y directions.

FIG. 1 is a schematic view showing the arrangement of the imprint apparatus 100. The imprint apparatus 100 includes a processing device 10 which performs a process (imprint process) of forming a pattern on the substrate 2, a vibration reduction unit 20 which reduces vibrations transferred from a base plate 5 (also called a support or a base) to the processing device 10, and a detector 6 which detects the vibrations of the base plate 5. In this case, the mold 1 used by the imprint apparatus 100 includes a pattern portion 1*a* having a rectangular peripheral shape and a three-dimensional uneven pattern formed on a surface facing the substrate 2. A material which can transmit ultraviolet light, for example, quartz, can be used as a material for the mold 1. In addition, for example, a single-crystal silicon substrate or SOI (Silicon on Insulator) substrate can be used as the substrate 2. A supply unit 14 (to be described later) supplies an imprint material to the surface to be processed of the substrate 2.

The processing device 10 will be described first. The processing device 10 includes a light irradiation unit 11, a mold holding unit 12, a substrate stage 13, the supply unit 14, a measurement unit 15, and a controller 16. The respective elements other than the controller 16 can be provided in a housing 17. The controller 16 includes, for example, a CPU and a memory, and controls each element of the processing device 10.

When performing an imprint process, the light irradiation unit 11 cures the imprint material 3 on the substrate by irradiating the imprint material 3 with light 4 (ultraviolet light) through the mold 1 while the mold 1 is in contact with the imprint material 3. The light irradiation unit 11 can include a light source 111 which emits the light 4 (ultraviolet light) for curing the imprint material 3 and an optical element 112 for adjusting the light 4 emitted from the light source 111 to light optimal for an imprint process.

When performing an imprint process, the mold holding unit 12 drives the mold 1 in the Z direction to contact or separate the mold 1 with or from the imprint material 3 on the substrate. The mold holding unit 12 can be constituted by a mold chuck 121 which chucks the mold 1 with a vacuum suction force or electrostatic force and a mold driving unit 122 which drives the mold 1 in the Z direction. In addition, the mold chuck 121 and the mold driving unit 122 each have an opening area in its central portion (inside) and are configured to irradiate the substrate 2 with the light 4 from the light irradiation unit 11 through the mold 1.

The substrate stage 13 is configured to move the substrate 2 in the X and Y directions so as to align the mold 1 with the substrate 2 when performing an imprint process. The substrate stage 13 can be constituted by, for example, a substrate chuck 131 which chucks the substrate 2 with a vacuum suction force or electrostatic force and a substrate driving unit 132 which drives the substrate 2 in the X and Y directions.

The supply unit 14 supplies (dispenses) the imprint material 3 (uncured resin) onto a substrate. As described above, the imprint apparatus 100 according to this embodiment uses, as an imprint material, an ultraviolet curing resin having a property of being cured by irradiation with light (ultraviolet light). In addition, the measurement unit 15 includes, for example, a scope having an image sensing device. The measurement unit 15 detects marks on a mold and marks on a substrate and measures the relative positions between the mold 1 and the substrate 2.

The vibration reduction unit 20 will be described next. The vibration reduction unit 20 can include, for example, a mounting table 21, a reaction force absorbing unit 22, a plurality of support members 23, a plurality of actuators 24, and a feed-forward controller 25 (to be referred to as the FF controller 25 hereinafter). The mounting table 21 is supported (fixed) on the base plate 5 (support) through a plurality of blocks 50 (leveling blocks), and supports the processing device 10 through the plurality of support members 23.

The reaction force absorbing unit 22 is configured to, for example, apply a force to a side surface of the processing device 10 (housing 17) so as to cancel a reaction force generated by the acceleration and deceleration of the substrate stage 13. The reaction force to the force applied to the processing device 10 is transferred to the base plate 5 through the mounting table 21 and the blocks 50.

The plurality of support members 23 are arranged between the processing device 10 and the mounting table 21 (base plate 5) and have, for example, spring or damper characteristics to elastically support the processing device 10. That is, the support members 23 are vibration reduction means for passively reducing vibrations transferred from the base plate 5 to the processing device 10. In addition, the plurality of actuators 24 are arranged between the processing device 10 and the mounting table 21 (base plate 5) to drive the processing device 10 (exert can action to the processing device 10) based on command values from the FF controller 25. That is, the plurality of actuators 24 are vibration reduction means for actively reducing vibrations transferred from the base plate 5 to the processing device 10 (housing 17). As the actuators 24, for example, linear motors or air actuators can be used.

The FF controller 25 is a compensator which determines a command value (for example, a current value) to be supplied to each actuator 24 based on an output signal from the detector 6 which detects the vibrations of the base plate 5. Processing performed by the FF controller 25 will be described in detail later. In this case, as the detector 6, for example, an acceleration sensor, speed sensor, or displacement sensor fixed to the base plate 5 can be used. However, this is not exhaustive. For example, a laser interferometer which irradiates the base plate 5 with light and detects the displacement of the base plate 5 by using reflected light may be used as the detector 6.

An imprint process performed by the processing device 10 of the imprint apparatus 100 will be described below. The controller 16 can control this imprint process. The controller 16 controls a substrate transfer unit (not shown) to transfer the substrate 2 onto the substrate stage 13, and controls the substrate stage 13 to hold the substrate 2. The controller then controls the substrate stage 13 to arrange the substrate 2 below the supply unit 14, and controls the supply unit 14 to supply the imprint material 3 to a shot area (target shot area), of the plurality of shot areas on the substrate, to which an imprint process is to be performed. The controller 16 then controls the substrate stage 13 to arrange the target shot area, to which the imprint material 3 has been supplied, below the mold 1.

After the target shot area is arranged below the mold 1, the controller 16 controls the mold holding unit 12 to bring the mold 1 into contact with the imprint material 3 on the substrate. The controller 16 then aligns the mold 1 with the substrate 2 based on the measurement result obtained by the measurement unit 15 while the mold is in contact with the imprint material on the substrate. Thereafter, the controller 16 controls the light irradiation unit 11 to irradiate the imprint material 3 with the light 4. After the imprint material on the substrate is cured by irradiation with the light 4, the controller 16 controls the mold holding unit 12 to separate the mold 1 from the imprint material 3 on the substrate. This makes it possible to form an uneven pattern on the imprint material 3 on the substrate.

First Embodiment

Figure 2A:
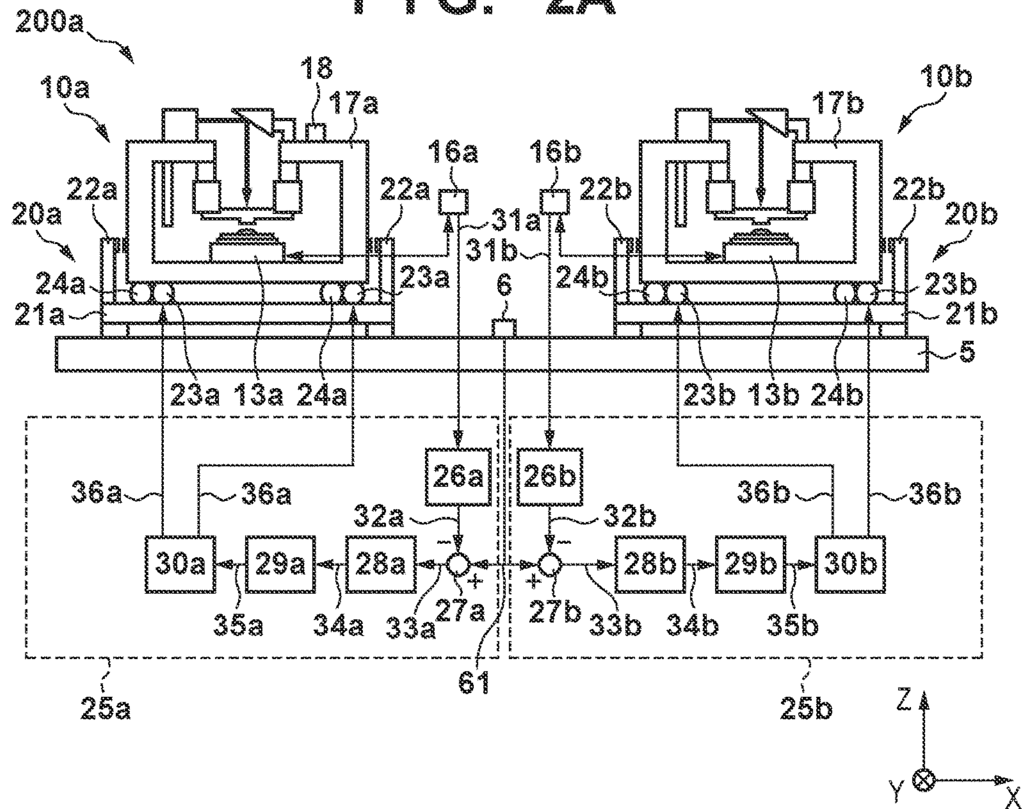
FIG. 2A is a schematic view showing an imprint apparatus according to the first embodiment.

An imprint apparatus **200*a* according to the first embodiment of the present invention will be described next. The imprint apparatus 200*a* according to the first embodiment is configured into a so-called cluster type that has a plurality of processing devices 10 provided on a common (same) base plate, as shown in FIG. 2A, to improve throughput. FIG. 2A shows an example of the arrangement of the cluster type imprint apparatus 200*a*, with a first processing device 10*a* and a second processing device 10*b* of the plurality of processing devices 10 being provided on a common base plate. The imprint apparatus 200*a* has a vibration reduction unit 20 provided for each of the first and second processing devices 10*a* and 10*b*, and is configured to individually control vibrations transferred from a base plate 5 to the first and second processing devices 10*a* and 10*b***.

For example, in the imprint apparatus **200*a* shown in FIG. 2A, the first processing device 10*a* (housing 17*a*) is mounted on a first vibration reduction unit 20***a*, and is controlled by a controller 16*a*. The first vibration reduction unit 20*a* can include a mounting table 21*a* supported on the base plate 5, a reaction force absorbing unit 22*a*, a plurality of support members 23*a*, a plurality of actuators 24*a*, and an FF controller 25*a* (first controller). In addition, the second processing device 10*b* (housing 17*b*) is mounted on a second vibration reduction unit 20*b*, and is controlled by a controller 16*b*. The second vibration reduction unit 20*b* can include a mounting table 21*b* supported on the base plate 5, a reaction force absorbing unit 22*b*, a plurality of support members 23*b*, a plurality of actuators 24*b* (second actuators), and an FF controller 25*b* (second controller). The function of each unit is the same as that described above. In this case, in the first embodiment, a common detector 6 is provided for the first vibration reduction unit 20*a* and the second vibration reduction unit 20*b*, and output signals from the detector 6 are commonly used by the FF controller 25*a* of the first vibration reduction unit 20*a* and the FF controller 25*b* of the second vibration reduction unit 20*b*.

In the cluster type imprint apparatus 200*a*, for example, the vibrations generated by the second processing device 10*b* when a movable object such as a mold holding unit 12 or a substrate stage 13 is driven can be transferred to the first processing device 10*a* through the base plate 5. That is, the second processing device 10*b* can include a driving mechanism as a vibration source. Vibrations transferred from the second processing device 10*b* to the first processing device 10*a* can cause the degradation of overlay precision or transfer precision (pattern fidelity) of the first processing device 10*a*. For this reason, it may be to provide a detector 6 for detecting the vibrations of the base plate 5 between the first processing device 10*a* and the second processing device 10*b* and control each actuator 24*a* for applying a force to the first processing device 10*a* based on an output signal from the detector 6.

However, the detector 6 provided in this manner can simultaneously detect the vibrations generated by the first processing device 10*a* as well as the vibrations generated by the second processing device 10*b*. The vibrations generated by the first processing device 10*a* propagate concentrically around the first processing device 10*a* outward to the base plate 5. For this reason, the vibrations are not transferred to the first processing device 10*a* after being detected by the detector 6. If, therefore, an output signal from the detector 6 is used without any process, the actuators 24*a* of the first vibration reduction unit 20*a* are controlled based on not only the vibrations generated by the second processing device 10*b* but also the vibrations generated by the first processing device 10*a*. That is, it can be difficult to control the actuators 24*a* so as to reduce vibrations transferred from the second processing device 10*b* to the first processing device 10*a* through the base plate 5.

In the imprint apparatus 200*a* according to this embodiment, the FF controller 25*a* of the first vibration reduction unit 20*a* estimates vibrations transferred from the first processing device 10*a* to the detector 6. More specifically, the FF controller 25*a* generates a first signal component 32*a*, of an output signal 61 from the detector 6, which originates from the vibrations generated by the first processing device 10*a* and transferred to the detector 6 through the base plate 5. The FF controller 25*a* then controls the actuators 24*a* of the first vibration reduction unit 20*a* based on the vibrations obtained by estimation and the vibrations detected by the detector 6, more specifically, a signal obtained by removing the first signal component 32*a* from the output signal 61 from the detector 6. This makes it possible to control the actuators 24*a* so as to reduce vibrations transferred from the second processing device 10*b* to the first processing device 10*a*.

In this case, this embodiment has exemplified the second processing device 10*b*, having the same arrangement as that of the first processing device 10*a*, as a mechanism which is supported on the base plate 5 and generates vibrations. However, this is not exhaustive. For example, a transfer unit (transfer arm) which transfers the mold 1 or the substrate 2 can be a target of this mechanism. Both the vibrations generated by the first processing device 10*a* and the vibrations generated by the second processing device 10*b* are those originating from the driving of a movable object such as the mold holding unit 12 or the substrate stage 13, and hence can include a common frequency band.

[Processing by FF Controller 25*a*]

The arrangement of the FF controller 25*a* of the first vibration reduction unit 20*a* and processing by the FF controller 25*a* will be described below. The FF controller 25*a* includes, for example, a first computing unit 26*a*, a subtractor 27*a*, a second computing unit 28*a*, a third computing unit 29*a*, and a fourth computing unit 30*a*.

The first computing unit 26*a* generates (calculates) the first signal component 32*a* originating from the vibrations generated by the first processing device 10*a* and transferred to the detector 6 through the base plate 5. The first signal component 32*a* is a signal component contained in the output signal 61 from the detector 6.

For example, the first computing unit 26*a* acquires, from the controller 16*a*, a drive command value 31*a* (for example, a current value) supplied to a movable object (for example, a substrate stage 13*a*) which generates vibrations in the first processing device 10*a*. At this time, the first computing unit 26*a* may acquire the drive command value 31*a* from the controller 16*a* in consideration of the time interval from the instant vibrations are generated by the first processing device 10*a* to the instant the vibrations are transferred to the detector 6. That is, the first computing unit 26*a* may acquire the drive command value 31*a* from the controller 16*a* supplied to the movable object the corresponding time before the detection of vibrations by the detector 6.

In addition, the first computing unit 26*a* has information about a first transfer function for the estimation of vibrations transferred from the first processing device 10*a* to the detector 6 based on the drive command value 31*a* supplied to the movable object (driving mechanism) of the first processing device 10*a*. The first computing unit 26*a* can then obtain the first signal component 32*a* by multiplying the acquired drive command value 31*a* by the first transfer function. The first transfer function is a transfer function which receives the drive command value 31*a* supplied to the movable object of the first processing device 10*a* and outputs the first signal component 32*a*.

The FF controller 25*a* (in cooperation with the controller 16*a*) can obtain the first transfer function based on the vibrations detected by the detector 6 when the driving mechanism of the first processing device 10*a* generates vibrations before an imprint process. For example, while the second processing device 10*b* generates no vibrations (the movable object is not driven), the FF controller 25*a* causes the first processing device 10*a* to generate vibrations by driving the movable object (for example, the substrate stage 13*a*) of the first processing device 10*a*. The FF controller 25*a* then causes the detector 6 to detect the vibrations. The FF controller 25*a* can obtain the first transfer function from the results obtained in this process (that is, the drive command value 31*a* and the output signal 61 from the detector 6).

In this case, the first transfer function may be obtained for each of a plurality of processes in which the first processing device 10*a* generates vibrations, for example, for each movable object which generates vibrations in the first processing device 10*a*, each of shot areas forming a pattern, or each step in an imprint process. In addition, a step of causing the first processing device 10*a* to generate vibrations and causing the detector 6 to detect the vibrations may be performed a plurality of times, and the first transfer function may be obtained by averaging a plurality of results obtained by the repeated steps.

The subtractor 27*a* subtracts the first signal component 32*a* obtained by the first computing unit 26*a* from the output signal 61 from the detector 6. This makes it possible to obtain a signal 33*a* by removing the first signal component 32*a* from the output signal 61 from the detector 6.

The second computing unit 28*a* obtains a signal 34*a* concerning vibrations transferred from the second processing device 10*b* to the first processing device 10*a* by multiplying the signal 33*a* from the subtractor 27*a* by a second transfer function. The second transfer function is a transfer function which receives the signal 33*a* obtained by removing the first signal component 32*a* from the output signal 61 from the detector 6 and outputs the signal 34*a*. The FF controller 25*a* (in cooperation with the controller 16*b*) can obtain the second transfer function before an imprint process. When obtaining the second transfer function, it is possible to use a vibration meter 18 (for example, an acceleration sensor) which detects the vibrations of the first processing device 10*a* (housing 17*a*).

For example, while the first processing device 10*a* generates no vibrations (the movable object is not driven), the FF controller 25*a* causes the second processing device 10*b* to generate vibrations by driving the movable object (for example, a substrate stage 13*b*) of the second processing device 10*b*. The FF controller 25*a* then causes the detector 6 and the vibration meter 18 to detect the vibrations. With this operation, the FF controller 25*a* can obtain the second transfer function based on the output signal 61 from the detector 6 and an output signal from the vibration meter 18 which are obtained in this step. At this time, the FF controller 25*a* can also obtain information indicating the time interval (to be referred to as the transfer time hereinafter) from the instant the detector 6 detects the vibrations generated by the second processing device 10*b* to the instant the vibrations are transferred to the first processing device 10*a*.

In this case, the second transfer function may be obtained for each of a plurality of processes in which the second processing device 10*b* generates vibrations, for example, for each movable object which generates vibrations in the second processing device 10*b*, each of shot areas forming a pattern, or each step in an imprint process. In addition, a step of causing the second processing device 10*b* to generate vibrations and causing the detector 6 and the vibration meter 18 to detect the vibrations may be performed a plurality of times, and the second transfer function may be obtained by averaging a plurality of results obtained by the repeated steps.

The third computing unit 29*a* obtains a force to be applied to the first processing device 10*a* to reduce vibrations transferred from the second processing device 10*b* to the first processing device 10*a* based on the signal 34*a* from the second computing unit 28*a*. The third computing unit 29*a* then obtains force information 35*a* indicating a force to be applied from each actuator 24*a* to the first processing device 10*a* by distributing the obtained force to each actuator 24*a*. In this case, a method of obtaining the force information 35*a* from the signal 33*a* from the subtractor 27*a* is not limited to the above method. For example, a restoring force and a viscous resistance force which act from the first planar portion 23*a* toward the first processing device 10*a* (housing 17*a*) may be obtained from the displacement of the mounting table 21*a*. More specifically, it is possible to obtain the force information 35*a* by multiplying the signal 33*a* from the subtractor 27*a* by a vibration transfer rate (also called a vibration transmissibility) from the detector 6 to the mounting table 21*a* and further multiplying the resultant signal by $(K/s^2+C/s)$, where K is the spring constant of the first planar portion 23*a*, C is an attenuation constant of the first planar portion 23*a*, and s is a Laplace operator.

The fourth computing unit 30*a* obtains a command value 36*a* (for example, a current value) to be supplied to each actuator 24*a* based on the force information 35*a* obtained by the third computing unit 29*a*. The fourth computing unit 30*a* then supplies the command value 36*a* to each actuator 24*a* based on information indicating the transfer time so as to generate a force in each actuator 24*a* to reduce vibrations transferred from the second processing device 10*b* to the first processing device 10*a* at the timing of the transfer of the vibrations. In this case, a response lag (response delay) indicating the time interval from the instant the command value 36*a* is supplied to the instant an operation corresponding to the command value 36*a* starts is generated in each actuator 24*a*. For this reason, the fourth computing unit 30*a* may supply the command value 36*a* to each actuator 24*a* so as to compensate for the response lag (response delay) in each actuator 24*a*. For example, the fourth computing unit 30*a* can compensate for the response lag (response delay) in the actuator 24*a* by multiplying the force information 35*a* by the reciprocal of the response characteristic of the actuator 24*a*. The response characteristic of the actuator 24*a* is an output from the actuator 24*a* with respect to the command value 36*a*, and can be measured in advance before an imprint process.

Configuring the FF controller 25*a* in this manner makes it possible for the imprint apparatus 200*a* according to this embodiment to control each actuator 24*a* to reduce vibrations transferred from the second processing device 10*b* to the first processing device 10*a* through the base plate 5. That is, it is possible to control each actuator 24*a* based on vibration components, of the vibrations detected by the detector 6, which can be transferred to the first processing device 10*a*. This allows the first processing device 10*a* to reduce the influence of vibrations generated by the second processing device 10*b* and accurately form a pattern on the imprint material 3 on the substrate.

[Processing by FF Controller 25*b*]

The arrangement of the FF controller 25*b* (second controller) of the second vibration reduction unit 20*b* and processing performed by the FF controller 25*b* will be described next. The FF controller 25*b* includes a first computing unit 26*b*, a subtractor 27*b*, a second computing unit 28*b*, a third computing unit 29*b*, and a fourth computing unit 30*b*. The FF controller 25*b* performs processing similar to that performed by the FF controller 25*a* of the first vibration reduction unit 20*a*. That is, the FF controller 25*b* performs a second estimation as an estimation of vibrations transferred from the second processing device 10*b* to the detector 6. More specifically, the FF controller 25*b* generates a second signal component 32*b*, of the output signal 61 from the detector 6, which originates from the vibrations generated by the second processing device 10*b* and transferred to the detector 6 through the base plate 5. The FF controller 25*b* then controls the actuator 24*b* of the second vibration reduction unit 20*b* based on the vibrations obtained by the second estimation and the vibrations detected by the detector 6, more specifically, a signal obtained by removing the second signal component 32*b* from the output signal 61 from the detector 6. This makes it possible to control the actuator 24*b* to reduce vibrations transferred from the first processing device 10*a* to the second processing device 10*b*.

The first computing unit 26*b* acquires, from the controller 16*b*, a drive command value 31*b* to be supplied to a movable object (for example, the substrate stage 13*b*) which generates vibrations in the second processing device 10*b*. The first computing unit 26*b* then obtains the second signal component 32*b* by multiplying the acquired drive command value 31*b* by the first transfer function. The subtractor 27*b* subtracts the second signal component 32*b* from the output signal 61 from the detector 6. The second computing unit 28*b* obtains a signal 34*b* concerning vibrations transferred from the first processing device 10*a* to the second processing device 10*b* by multiplying a signal 33*b* from the subtractor 27*b* by the second transfer function. The third computing unit 29*b* obtains force information 35*b* indicating a force to be applied from each actuator 24*b* to the second processing device 10*b* to reduce vibrations transferred from the first processing device 10*a* to the second processing device 10*b* based on the signal 34*b* from the second computing unit 28*b*. The fourth computing unit 30*b* obtains a command value 36*b* (for example, a current value) to be supplied to each actuator 24*b* based on the force information 35*a* obtained by the third computing unit 29*b*, and controls each actuator based on the obtained command value 36*b*.

Configuring the FF controller 25*b* in this manner makes it possible for the imprint apparatus 200*a* according to this embodiment to control each actuator 24*b* to reduce vibrations transferred from the first processing device 10*a* to the second processing device 10*b* through the base plate 5. That is, it is possible to control each actuator 24*b* based on vibration components, of the vibrations detected by the detector 6, which can be transferred to the second processing device 10*b*. This allows the second processing device 10*b* to reduce the influence of vibrations generated by the first processing device 10*a* and accurately form a pattern on the imprint material 3 on the substrate.

Second Embodiment

Figure 2B:
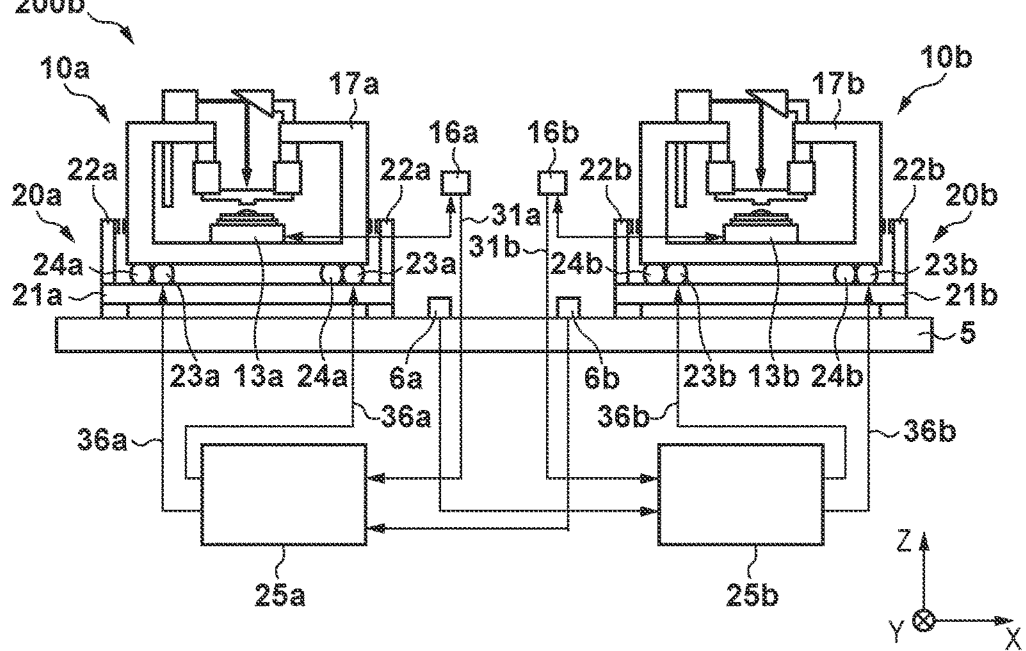
FIG. 2B is a schematic view showing an imprint apparatus according to the second embodiment.

An imprint apparatus 200*b* according to the second embodiment of the present invention will be described. The first embodiment has exemplified the case in which the detector 6 is commonly provided for the first vibration reduction unit 20*a* and the second vibration reduction unit 20*b*. The second embodiment will exemplify a case in which detectors 6 are separately provided for a first vibration reduction unit 20*a* and a second vibration reduction unit 20*b*. FIG. 2B shows the imprint apparatus 200*b* according to the second embodiment. The imprint apparatus 200*b* shown in FIG. 2B has a first detector 6*a* provided for the first vibration reduction unit 20*a* and a second detector 6*b* provided for the second vibration reduction unit 20*b*. Other arrangements are the same as those of the imprint apparatus 200*a* according to the first embodiment.

The first detector 6*a* may be arranged such that the transfer time taken between the instant vibrations generated by the second processing device 10*b* are detected by the first detector 6*a* and the instant the vibrations are transferred to the first processing device 10*a* becomes larger than the sum of the computing time taken by an FF controller 25*a* and the response lag (response delay) of each actuator 24*a*. For this purpose, the first detector 6*a* may be arranged to detect vibrations at a portion of the base plate 5 which is located closer to the second processing device 10*b* than the first processing device 10*a*.

Likewise the second detector 6*b* may be arranged such that the transfer time taken between the instant the vibrations generated by the first processing device 10*a* are detected by the second detector 6*b* and the instant the vibrations are transferred to the second processing device 10*b* becomes larger than the sum of the computing time taken by an FF controller 25*b* and the response lag (response delay) of each actuator 24*b*. For this purpose, the second detector 6*b* may be arranged to detect vibrations at a portion of the base plate 5 which is located closer to the first processing device 10*a* than the second processing device 10*b*.

Third Embodiment

Figure 3:
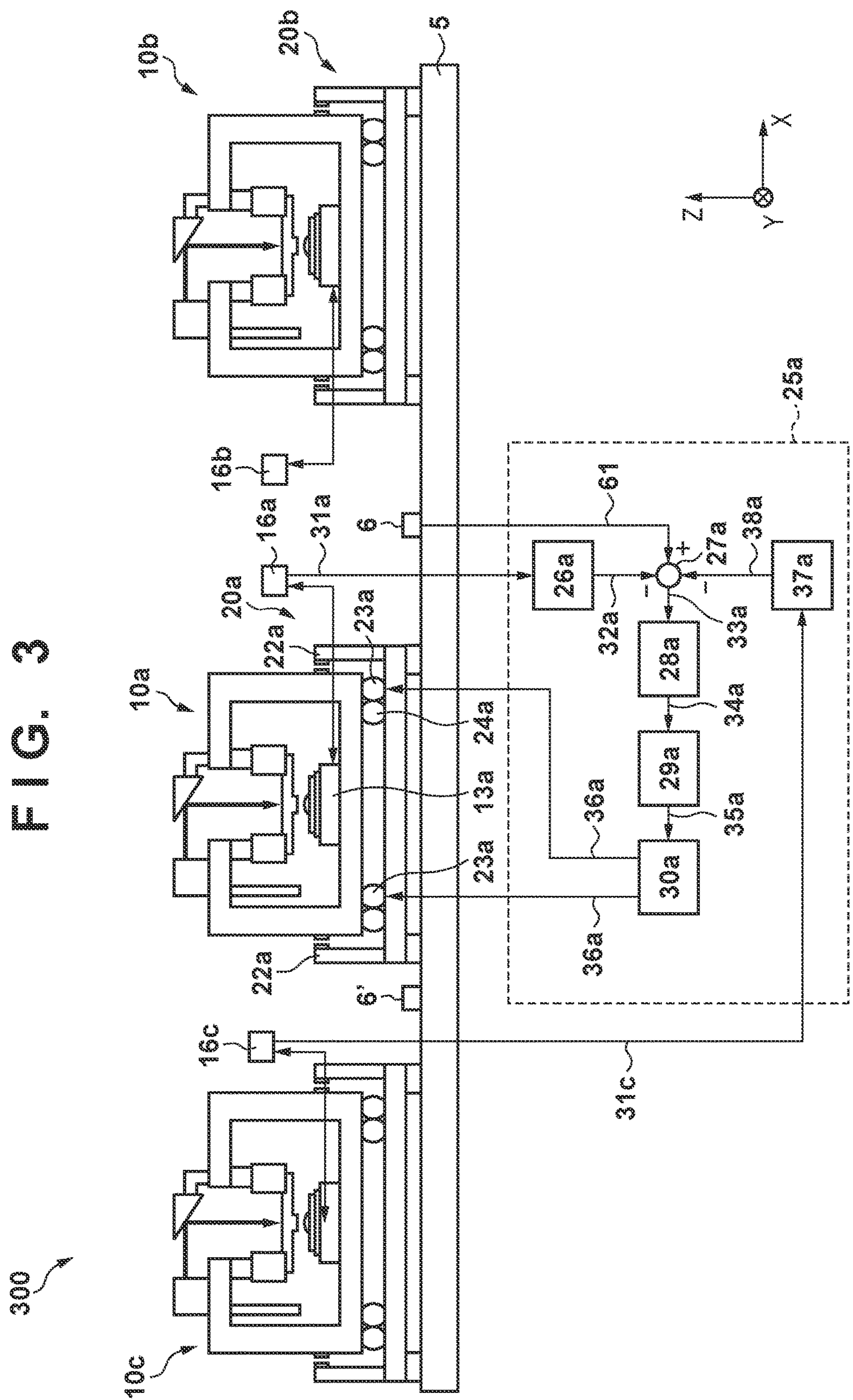
FIG. 3 is a schematic view showing an imprint apparatus according to the third embodiment.

An imprint apparatus 300 according to the third embodiment of the present invention will be described. FIG. 3 shows the imprint apparatus 300 according to the third embodiment. The imprint apparatus 300 according to the third embodiment can include a first processing device 10*a*, a second processing device 10*b*, and a third processing device 10*c* which are provided on a common base plate. The third processing device 10*c* is arranged on the opposite side of the first processing device 10*a* to the second processing device 10*b*. That is, the third processing device 10*c* is arranged such that the first processing device 10*a* is arranged between the second processing device 10*b* and the third processing device 10*c*.

This embodiment exemplifies the third processing device 10*c* having the same arrangement as that of the first processing device 10*a* as the second mechanism which is supported on a base plate 5 and generates vibrations. However, this is not exhaustive. For example, a transfer unit (transfer arm) which transfers a mold 1 or a substrate 2 can be a target of the second mechanism. All the vibrations generated by the first processing device 10*a*, the second processing device 10*b*, and the third processing device 10*c* are those originating from the driving of a movable object such as a mold holding unit 12 or a substrate stage 13, and hence can include a common frequency band.

In the imprint apparatus 300 having this arrangement, the vibrations generated by the third processing device 10*c* propagate concentrically around the third processing device 10*c* outward to the base plate 5 and are transferred to a detector 6 arranged between the first processing device 10*a* and the second processing device 10*b*. These vibrations are not transferred to the first processing device 10*a* after being detected by the detector 6. For this reason, an FF controller 25*a* of the first vibration reduction unit 20*a* in the third embodiment performs a third estimation as an estimation of vibrations transferred from the third processing device 10*c* to the detector 6. More specifically, the FF controller 25*a* generates a third signal component 38*a*, of an output signal from the detector 6, which originates from the vibrations generated by the third processing device 10*c* and transferred to the detector 6 through the base plate 5. The FF controller 25*a* then controls each actuator 24*a* based on also the vibrations obtained by the third estimation, more specifically, a signal obtained by further removing the third signal component 38*a* from an output signal 61 from the detector 6.

More specifically, the FF controller 25*a* further includes a fifth computing unit 37*a*. The fifth computing unit 37*a* generates the third signal component 38*a* originating from the vibrations generated by the third processing device 10*c* and transferred to the detector 6 through the base plate 5. The third signal component 38*a* is a signal component contained in the output signal 61 from the detector 6.

For example, the fifth computing unit 37*a* acquires, from a controller 16*c* which controls the third processing device 10*c*, a drive command value 31*c* to be supplied to a movable object which generates vibrations in the third processing device 10*c*. At this time, the fifth computing unit 37*a* may acquire the drive command value 31*c* from the controller 16*c* in consideration of the time interval from the instant vibrations are generated by the third processing device 10*c* to the instant the vibrations are transferred to the detector 6. That is, the fifth computing unit 37*a* preferably acquires the drive command value 31*c* from the controller 16*c* supplied to the movable object the corresponding time before the detection of vibrations by the detector 6.

The fifth computing unit 37*a* can then obtain the third signal component 38*a* by multiplying the acquired drive command value 31*c* by the third transfer function. The third transfer function is a transfer function which receives the drive command value 31*c* supplied to the movable object of the third processing device and outputs the third signal component 38*a*. The FF controller 25*a* (in cooperation with the controller 16*c*) can obtain the third transfer function before an imprint process. For example, while the first processing device 10*a* and the second processing device 10*b* generate no vibrations, the FF controller 25*a* causes the third processing device 10*c* to generate vibrations by driving the movable object of the third processing device 10*c*. The FF controller 25*a* then causes the detector 6 to detect the vibrations. The FF controller 25*a* can obtain the third transfer function from the results obtained in this step (that is, the drive command value 31*c* and an output signal 61 from the detector 6).

The subtractor 27*a* subtracts a first signal component 32*a* and the third signal component 38*a* from the output signal 61 from the detector 6. Processes performed by the second to fourth computing units are the same as those in the first embodiment, and hence a description of them will be omitted.

In this case, the FF controller 25*a* can control each actuator 24*a* to reduce vibrations transferred from the third processing device 10*c* to the first processing device 10*a* by a method similar to that described above. That is, the FF controller 25*a* can control each actuator 24*a* based on also an output signal from a detector 6' which detects the vibrations of the base plate 5 between the first processing device 10*a* and the third processing device 10*c*.

In addition, the FF controller 25*a* repeats a step of calculating the command value 36*a* to be supplied to each actuator 24*a* from the output signal 61 from the detector 6. This can lead to an enormous amount of computation. For this reason, the FF controller 25*a* may be configured to calculate the command value 36*a* when an output signal from the detector 6 exceeds a threshold. A threshold can be set in accordance with, for example, the transfer precision (the pattern fidelity) required when transferring a pattern on the mold 1 onto the substrate 2. For example, the relationship between the amount of vibrations of the first processing device 10*a* and transfer precision is obtained by a simulation or the like, and the amount of vibrations corresponding to an allowable value of transfer precision is determined from the obtained relationship. A value obtained by dividing the determined amount of vibrations by the vibration transfer rate (the vibration transmissibility) between the first processing device 10*a* and the detector 6 is set as a threshold.

<Embodiment of Method of Manufacturing Article>

A method of manufacturing an article according to an embodiment of the present invention is suitable for manufacturing an article such as a microdevice such as a semiconductor device or an element having a microstructure. This method of manufacturing an article according to this embodiment includes a step of forming a pattern on a substrate by using the above lithography apparatus and a step of processing the substrate on which the pattern has been formed in the preceding step. The manufacturing method further includes other known steps (oxidation, film formation, deposition, doping, planarization, etching, resist removal, dicing, bonding, packaging, and the like). The method of manufacturing an article according to the embodiment is superior to the conventional method in at least one of the performance of an article, quality, productivity, and production cost.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-030264 filed on Feb. 19, 2016, which is hereby incorporated by reference herein in its entirety.

What is claimed is:

1. A lithography apparatus comprising:

a first processing device supported by a base and configured to form a pattern on a substrate;

a first actuator configured to exert an action to the first processing device;

a detector configured to detect vibrations of the base at a position between the first processing device and a first mechanism supported by the base; and a first controller configured to control the first actuator to reduce vibrations generated in the mechanism and transferred to the first processing device through the base, wherein the first controller is configured to estimate a first signal component, caused by vibrations generated in the first processing device and transferred to the base, of an output signal from the detector, and control the first actuator based on a first signal obtained by removing the estimated first signal component from the output signal.

2. The apparatus according to claim 1, wherein the vibrations transferred from the first processing device to the base and the vibrations transferred from the first mechanism to the base have a frequency common thereto.

3. The apparatus according to claim 1, wherein each of the first processing device and the first mechanism includes a driving device for driving a movable object, as a vibration source.

4. The apparatus according to claim 3, wherein the first controller has information of a transfer function for estimating the first signal component based on a command value to be supplied to the driving device included in the first processing device.

5. The apparatus according to claim 4, wherein the first controller is configured to obtain the information of the transfer function based on vibrations detected by the detector in a case where the driving device included in the first processing device generates vibrations.

6. The apparatus according to claim 1, wherein the first controller is configured to control the actuator to reduce vibrations, that transfer to the first processing device, of the vibrations detected by the detector.

7. The apparatus according to claim 1, wherein the detector is configured to detect vibrations at a portion of the base located closer to the first mechanism than to the first processing device.

8. The apparatus according to claim 1, further comprising:

a second processing device supported by the base and configured to form a pattern on a substrate;

a second actuator configured to exert an action to the second processing device; and a second controller configured to control the second actuator to reduce vibrations generated in the first processing apparatus and transferred to the second processing device through the base, wherein the second controller is configured to estimate a second signal component caused by vibrations generated in the second processing device and transferred to the base, of the output signal from the detector, and control the second actuator based on a second signal obtained by removing the estimated second signal component from the output signal.

9. The apparatus according to claim 1, wherein:

the first controller is configured to estimate a second signal component caused by vibrations generated in a second mechanism and transferred to the base, of the output signal from the detector, and control the first actuator-based on a second signal obtained by further removing the estimated second signal component from the output signal, and the second mechanism is supported by the base, and the first processing device is located between the first mechanism and the second mechanism.

10. A method of manufacturing an article, the method comprising the steps of:

forming a pattern on a substrate using a lithography apparatus; and processing the substrate, on which the pattern has been formed, to manufacture the article, wherein the lithography apparatus includes:

a processing device configured to form the pattern;

an actuator configured to exert an action to the processing device;

a detector configured to detect vibrations of the base at a position between the processing device and a mechanism supported by the base; and a controller configured to control the actuator to reduce vibrations generated in the mechanism and transferred to the processing device through the base, wherein the controller is configured to estimate a signal component, caused by vibrations generated in the processing device and transferred to the base, of an output signal from the detector, and control the actuator based on a signal obtained by removing the estimated signal component from the output signal.

11. The apparatus according to claim 1, wherein:

the first processing device forms the pattern on the substrate by transferring a pattern formed in an original onto the substrate, and the first processing device includes a first driving device that drives the original and a second driving device that drives the substrate, as vibration sources.

12. The apparatus according to claim 1, further comprising:

the first mechanism, wherein the first mechanism includes a second processing device supported by the base and configured to form a pattern on a substrate.

13. The apparatus according to claim 1, wherein the first controller is configured to control the first actuator to exert an action to the first processing device at a timing when vibrations generated in the first mechanism and detected by the detector is to be transferred to the first processing unit.

14. The apparatus according to claim 1, wherein the output signal from the detector includes the first signal component and a second signal component, the first signal component being caused by vibrations generated in the first processing device and transferred to the base, and the second signal component being caused by vibrations generated in the first mechanism and transferred to the base.

* * * * *